United States Patent
Kud et al.

(10) Patent No.: US 6,562,127 B1
(45) Date of Patent: May 13, 2003

(54) METHOD OF MAKING MOSAIC ARRAY OF THIN SEMICONDUCTOR MATERIAL OF LARGE SUBSTRATES

(75) Inventors: Francis Kud, Arnold, MD (US); Karl Hobart, Upper Marlboro, MD (US); Mike Spencer, Washington, DC (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 10/046,534

(22) Filed: Jan. 16, 2002

(51) Int. Cl.⁷ .............................. C30B 2/02; C30B 25/04
(52) U.S. Cl. ..................... 117/94; 117/97; 117/915; 438/455; 438/456; 438/457; 438/458
(58) Field of Search ..................... 117/94, 97, 915; 438/455, 456, 457, 458

(56) References Cited

U.S. PATENT DOCUMENTS

| | | |
|---|---|---|
| 5,374,564 A | 12/1994 | Bruel |
| 5,391,257 A | 2/1995 | Sullivan et al. |
| 5,401,544 A | 3/1995 | Nakahata et al. |
| 5,446,330 A | 8/1995 | Eda et al. |
| 5,448,126 A | 9/1995 | Eda et al. |
| 5,630,949 A | 5/1997 | Lakin |
| 5,714,395 A | 2/1998 | Bruel |
| 5,877,070 A | 3/1999 | Goescle et al. |
| 5,882,987 A | 3/1999 | Srikrishman |
| 5,966,620 A | 10/1999 | Sakaguchi et al. |
| 5,994,207 A | 11/1999 | Henley et al. |
| 6,010,579 A | 1/2000 | Henley et al. |
| 6,020,252 A | 2/2000 | Aspar et al. |
| 6,054,370 A | 4/2000 | Doyle |
| 6,103,597 A | 8/2000 | Aspar et al. |
| 6,328,796 B1 | 12/2001 | Kub et al. |

OTHER PUBLICATIONS

Cioccio et al, Silicon carbide on insulator formation by the Smart–Cut process, Materials Science & Engineering B46 (1997) 349–356.

Aspar et al. The generic nature of the Smart–Cut process for thin film transfer, J. Elec. Mat., vol. 30, Bi, 7, 2001, pp. 834–840.

Hobart et al, Transfer of ultrathin silicon layers to polycrystallline SiC substrates for the growth of 3C–SiC epitaxial films, J. The Electrochemical Society, 146 (10) 3833–3836 (1999).

Tong et al, Layer splitting process in hydrogen–implanted Si, Ge, SiC, and diamond substrates, Amer. Inst. of Physics. [S0003–6951 (97) 03211–7], 1997.

Bruel, Silicon on insulator material technology, Electronics Letters, vol. 31, No. 14, 1995, pp. 1201–1202.

Kub, Single–crystal ferroelectronic microwave capacitor fabricated by hydrogen implantation, Electroncis Letters, vol. 35, No. 6, (1999).

Hobart et al, Transfer of GaSb thin film to insulating substrate via separation by hydrogen implantation, Electronics Letters, vol. 35, No. 8, (1999).

*Primary Examiner*—Felisa Hiteshew
(74) *Attorney, Agent, or Firm*—John J. Karasek; George A. Kap

(57) ABSTRACT

A method for making an array of thin single-crystal substrates on a handle substrate comprising the steps: attaching a plurality of single-crystal substrates to a face of a support wafer; polishing said plurality of attached single-crystal substrates so that said single-crystal substrates surfaces are coplanar on said support surface and to a selected surface roughness; implanting a hydrogen to a selected depth into said attached single-crystal substrates; bonding said polished and hydrogen implanted attached single-crystal substrates to a first handle substrate; and splitting said polished and hydrogen implanted attached single-crystal substrates at said selected depth thereby forming an array of thin single-crystal substrates on said first handle substrate and a support wafer having a remaining portion of said attached single-crystal substrates.

25 Claims, 3 Drawing Sheets

METHOD OF MAKING MOSAIC ARRAY OF THIN SEMICONDUCTOR MATERIAL OF LARGE SUBSTRATES

BACKGROUND OF THE INVENTION

1. Field of the Invention

The present invention relates generally to structure and method for making a laterally tiled array of thin single-crystal material substrates that are bonded to the surface of a large diameter handle substrate.

2. Description of Related Art

There are many single-crystal substrates that are only available in small size and are also quite expensive. For example, the cost of a 50 mm diameter conductive SiC substrate is approximately $1000. The cost for a 50 mm diameter semi-insulating SiC substrate is approximately $5000. Another important issue is that small size substrates are not compatible with factory processing equipment in modern silicon or GaAs integrated circuit processing foundry. Most silicon processing facilities currently use either 150 mm or 200 mm diameter substrate dimension. GaAs processing facilities typically use 100 mm to 150 mm diameter substrate dimensions. Examples of other single-crystal materials that are expensive and are generally available in small substrate sizes are CdTe, CdZnTe, ZnO, GaSb, GaP, InAs, MgO, $LaAlO_3$, $BaTiO3$, $SrTiO_3$, MgO, $LiNbO_3$, LiTaAl, $SrBaNbO_3$, crystalline metal, and highly oriented pryolitic graphite.

Both single-crystal and non-single-crystalline large diameter substrates can be used as handle substrates for the tiled array of thin single-crystal material layers. Examples of single-crystal substrates that have diameters of three inches or larger are: silicon, GaAs, sapphire, InP, GaP, LiNbO3, and germanium.

Non-single-crystalline ceramic substrates can be designed to have optimized mechanical, thermal expansion, thermal conduction, or electrical conduction properties and can generally be obtained as large diameter substrates as describe in U.S. patent application Ser. No. 09/243,182 now U.S. Pat. No. 6,328,796. One polycrystalline ceramic substrate that has especially desirable properties is poly-SiC. Poly-SiC substrates are manufactured commercially in hot pressed, reaction bonded, and chemical vapor deposited (CVD) form. The CVD poly-SiC substrates are available commercially in substrate sizes up to 200 mm diameter, with thermal impedance as high as 310 W/mK, electrical resistivity as high as 100,000 ohm-cm, electrical impedance as low as 1 ohm-cm, melting temperature of 2000° C., and thermal expansion comparable to single-crystal cubic-SiC. Hot pressed sintered poly-SiC substrates are commercially available that have many of the above characteristics, but with electrical impedances as low as 0.1 ohm-cm. Ceramic AlN substrates are available commercially is substrate sizes to 100 mm square, with thermal impedances as high as 170 W/mK, electrical resistivity as high as $10^{14}$ ohm-cm at room temperature, and excellent thermal expansion matching to single-crystal GaN. Polycrystalline diamond has thermal conductivity as high as 1000 W/mK. Ceramic silicon nitride has good thermal expansion matching to silicon. Ceramic graphite substrates are available with electrical impedances as small as 0.01 ohm-cm. AlSiC substrates are commercially available, and have good expansion matching to silicon.

Wide bandgap gallium nitride (GaN) material has recently been demonstrated to be very beneficial for microwave power transistor applications, and for blue-green laser and light emitting diodes (LED). GaN epitaxial layers have typically been grown on a sapphire substrate and on single-crystal SiC substrates. There are continuing searches for new substrates for GaN growth. Sapphire is electrically insulating, a disadvantage for vertical current conducting optical emitters and power devices, and has relatively high thermal impedance which is a disadvantage for high power microwave devices. The best quality GaN epitaxial layers have been obtained for material grown on SiC substrates; however, single-crystal SiC substrates are very expensive and are only available in small substrate sizes. A recent technique that has shown improved GaN material quality is the lateral epitaxial overgrowth (LEO) technique on SiC or sapphire substrates.

An important substrate material for infrared imagers is either CdTe or CdZnTe substrate material. The largest substrate size that is generally available is 50 mm×50 mm square. HgCdTe material is typically epitaxially grown on the CdTe or CdZnTe material to implement midwave and long wavelength infrared detectors. Because of the size limitation, there has been significant research performed to grow HgCdTe directly on a silicon substrate. Some of the advantages of the growth of HgCdTe material on silicon substrate are larger substrate size, thermal expansion match of HgCdTe detector on silicon-to-silicon readout circuits, flat wafers for improved bump bonding yield, and substrate size that is compatible integrated circuit processing equipment. While it has been demonstrated that HgCdTe material can be grown on (211) silicon with sufficient material quality for midwave infrared focal plane array (IRFPA), the material quality is not yet satisfactory for long wavelength IRFPA. The normal configuration for an infrared focal plane array is to bump bond the infrared imager to a silicon readout integrated circuit. In this configuration, the infrared imager is illuminated from the backside. Thus, it is desirable that the substrate upon which the infrared absorbing material is grown be transmissive in the infrared. An important substrate material for midwave infrared detectors arrays is InSb. In the typical infrared focal plane array configuration, InSb infrared detector array is bump bonded to a silicon readout integrated circuit and then the InSb is thinned to approximately 10 micron thickness to allow back-illumination of the infrared focal plane array.

There are a number of light emitting devices (LED) that are made using III-V materials, SiC, GaN, InGaN or ZnS materials. It is sometimes desirable to fabricate the LEDs on an optically transparent substrate so that the light emission can pass through the substrate.

An important requirement for microwave integrated circuits is that the transistors be fabricated on an insulating substrate. An insulating substrate is important to obtain low loss transmission lines and inductors with high quality factor. There are some materials such as InAs and InSb that have transistors with excellent high frequency properties; however, the conductivity of the substrate is generally too high to allow microwave transmission lines and inductors.

A provisional patent application filed on Jun. 30, 1998 by Kub and Hobart, U.S. Pat. No. 6,323,108, discussed several techniques to make ultra-thin wafer bonded material layers. U.S. Pat. No. 5,374,564 to M. Bruel describes another method of fabricating thin wafer bonded semiconductor layer that involves combining wafer bonding with a hydrogen implantation and separation technique. The hydrogen implantation and separation technique utilizes a large dose of implanted hydrogen together with subsequent annealing to produce hydrogen exfoliation that releases the host substrate to generate the silicon-on-insulator (SOI) structure.

The surface following exfoliation has a microroughness of about 8 nm, and must be given a slight chemical mechanical polish to produce a prime surface. The polishing step degrades the Si layer thickness uniformity and makes the process unsuitable for producing very thin Si film.

It has been found experimentally that there are a number of techniques to either reduce the required hydrogen ion implantation dose or to reduce the temperature needed to cause hydrogen ion implantation substrate layer splitting process to work. One technique involves the use of a high-pressure nitrogen gas steam directed towards the side of a silicon substrate into which a high dose hydrogen ion implantation has been made. It has been experimentally found that the hydrogen ion implantation substrate layer splitting process can occur at room temperature for the case of a silicon substrate into which a high hydrogen ion implantation dose has been made using the high-pressure nitrogen gas stream method. It has also been found experimentally that a helium ion implantation made in combination with a hydrogen ion implantation can be used to achieve a lower total implanted dose for the substrate layer splitting process to occur for a given anneal temperature. It has also been found experimentally that a lower substrate layer splitting temperature is achieved for the case that a hydrogen ion implantation is made into a silicon substrate having a high boron concentration. The high boron concentration can be incorporated into a silicon substrate by ion implantation. The lower temperature for hydrogen ion implantation substrate layer splitting to occur is obtained both for the case that the boron implant is annealed and for the case that the boron implant is unannealed.

Direct wafer bonding typically requires that the surfaces of the substrates to be bonded be polished to a root mean square (RMS) surface roughness of less than 1 nm. Most materials can be polished to a surface roughness condition of less than 1nm RMS, however, extensive polishing is required for some materials such as silicon carbide and diamond to achieve this surface roughness condition. There are a number of approaches that can be utilized to achieve a small surface roughness on substrates to be wafer bonded. One approach is to deposit a material such as polysilicon, silicon dioxide, silicon nitride, or metal on the substrate surface, and then polish the material to a surface roughness of less than 1 nm RMS. The use of pressure, temperature, or vacuum separately in combination also reduces the requirement to have a surface polishing of 1 nm or less. If one of the substrates is thin, then the thin substrate will more easily conform to the other substrate during bonding and thus reduce the requirement for surface roughness less than 1 nm RMS. Metals can be deposited on the substrate surface and the metals will bond to the second substrate surface with the help of pressure, temperature, and vacuum possibly by forming a eutectic with the second substrate material. Metals can be deposited on both substrate surfaces and bonded. Brazing or soft solder materials can be deposited on one or both surfaces and the substrates bonded. Preceramic polymers can be used to bond two substrates. Ceramic materials can be deposited on one or both substrate surfaces, the substrates heated to the melting point of the ceramic material sometime under pressure, and the two substrates bonded. Materials such as silicon and germanium that melt during bonding and react with the substrate material can be used to bond two SiC substrates together. Electrostatic or anodic bonding can be used to bond a substrate to an alkali containing glass material. In some cases, alkali-containing glass can be deposited on one surface by sputter or evaporation and anodic bonding performed. A rough surface can be coated with a spin-on-glass to achieve a surface smooth enough for bonding. A low melting point frit or solder glass can be deposited on a surface and bonded to a second surface using pressure and temperature. A sodium silicate material deposited on a substrate surface will aid bonding. Bonding approaches that are appropriate for lower temperatures include polymer adhesive, organic adhesive, and epoxy bonding. The ambient is sometimes important during the bonding operation. For bonding of GaAs substrates, it is generally preferred to have hydrogen ambient during bonding.

SUMMARY OF THE INVENTION

Accordingly, it is an object of this invention to provide the structure and method for fabricating a laterally tiled array of thin single-crystal material substrates that are bonded to the surface of a large diameter handle substrate utilizing the techniques of hydrogen and/or helium ion implant layer splitting and wafer bonding for the purpose of making an effectively large substrate of thin single-crystal material for the purpose of manufacturing electronic or optical-electronic devices in the thin single-crystal material and in epitaxial layers grown on the thin single-crystal material.

Another objective of this invention to provide a manufacturing method to repeat the operation of splitting-off and transferring thin signal-crystal material layers from either a normal thickness single-crystal substrate or from an thick epitaxial layer grown on a single-crystal substrate to large diameter handle substrates multiple times in order to reduce the effective cost for large diameter handle substrates containing a laterally tiled array of thin single-crystal material layers. The manufacturing method can be such that a number of single-crystal material layers are transferred to the large diameter handle wafer simultaneously in the same bonding and spitting operation, or the thin single-crystal material layers can be transferred to the large diameter handle substrate one at a time in individual bonding and splitting operations and achieve a low surface roughness on the surface that is desirable for epitaxial growth and electronic device operation. The surface of the single-crystal material layers that has undergone the hydrogen and/or helium material splitting operation will likely be polished or etched to remove a selected amount of material beneath the spit surface to remove the crystal damage created by the splitting operation. An anneal step will also likely be performed to anneal out the ion implant generated point defect damage in the single-crystal material.

Another object of this invention to is to grow epitaxial layers, including the technique of lateral epitaxy overgrowth layers, on the surface of the laterally tiled array of thin single-crystal material layers that are bonded to the surface of the large diameter handle substrate.

Another object of this invention is to provide a method to fabricate a laterally tiled array of thin single-crystal substrates bonded to the surface of an optimized large diameter non-single crystalline handle substrate with the non-single-crystalline handle substrate selected to have mechanical, thermal expansion, thermal conduction, electrical conduction, and optical transmission properties matched to the epitaxial growth of material on the thin single-crystal substrates or to increase the performance of electronic devices fabricated in the thin single-crystal substrates or in the epitaxial material grown on the thin laterally tiled single-crystal material layers. Examples of non-single-crystalline substrates that have desirable properties for electronic or optical-electronic devices include ceramic poly- SiC, poly-AlN, BN, graphite, silicon nitride, diamond, fused silica, or quartz. Several examples of how the non-single-crystalline substrate can be selected for optimized epitaxial material growth or optimized electronic device performance is the case of epitaxial layers of SiC or GaN grown on thin laterally tiled arrays of single-crystal 6H- or 4H-SiC that are bonded to a poly-SiC or poly-AlN ceramic substrates. The poly-SiC and poly-AlN substrate have a high thermal conductivity which is important for microwave power transistor applications, can be insulating which is important for microwave applications, and there is a good thermal expansion match between SiC epitaxial layers and poly-SiC substrates or alternately, a good expansion match between GaN or InGaN epitaxial layers and poly-AlN substrates. The non-single-crystalline ceramic material may be encapsulated with a high purity material such as chemical vapor deposited (CVD) silicon nitride, CVD SiC, etc. that acts as a diffusion barrier to contain impurities that are within the ceramic form diffusing out of the ceramic during high temperature epitaxial growth operations or integrated circuit processing operations.

Another object of this invention is to provide a method to fabricate a laterally tiled array of thin single-crystal substrates bonded to the surface of optimized large diameter single-crystal or optimized ceramic handle substrate utilizing the techniques of hydrogen and/or helium ion implant layer splitting and wafer bonding for the epitaxial growth of wide bandgap material layers such as SiC, AlN, GaN, InGaN, BN, diamond, ZnSe, etc. material layers on tiled array of thin single-crystal material layers for the purpose of manufacturing electronic devices or optical-electronic devices in the thin single-crystal material and growing epitaxial layers on the thin single-crystal material. Examples of large diameter handle substrate material that are suitable for the epitaxial growth of wide bandgap material on the tiled array of single-crystal material include ceramic substrates such as poly-SiC, poly-AlN, graphite, silicon nitride, diamond, fused silica, quartz, etc and single crystal substrates such as sapphire, silicon, GaAs, InP, etc. It is generally desirable that there be a good lattice match between the wide bandgap material epitaxial layer and the thin tiled array of single-crystal material layers. Examples of suitable thin single crystal material layers for the epitaxial growth of wide bandgap hexagonal polytype growth of GaN and InGaN include 6H-polytype and 4H-polytype of SiC, ZnO, and etc. single-crystal material. Epitaxial hexagonal polytype SiC layers can be grown on the laterally tiled array of 6H-polytype and 4H-polytype of SiC single-crystal material. The best SiC epitaxial layer growth is generally obtained for growth temperatures of 1500° C.–1600° C. Thus, it is desirable that large diameter handle substrate material be compatible with the high SiC growth temperature. Several suitable substrates for this high temperature SiC growth include poly-SiC, poly-AlN and sapphire. It is also desirable that there be good match between the thermal expansion coefficient of the epitaxial layer and the thermal expansion coefficient of the large diameter handle substrate material in order to prevent cracking for thick epitaxial layer growth. GaN and InGaN lateral overgrowth epitaxial layers can also be grown on the laterally tiled array of single-crystal SiC material substrates that are bonded to the surface of a large diameter substrate. Lateral epitaxial overgrowth layers of SiC and GaN can be made on the thin single-crystal substrates. Applications for wide bandgap electronic and opto-electronic devices include lateral current conducting microwave power devices, vertical current conducting microwave power devices, lateral current conducting power switching devices, vertical current conducting power switching devices, high temperature devices, vertical and lateral current conducting optical laser and LED emitters. For a lateral current conducting microwave and power switching device, it is likely desirable to have an insulating non-single-crystalline substrate with high thermal conductivity. Also, for lateral current conducting microwave device, power switching device, and piezoelectric resistor device, it may be desirable to have a dielectric insulating layer such as silicon dioxide, silicon nitride, or tantalum oxide between the thin laterally tiled array of single-crystal substrate and the large diameter handle substrate. For vertical current conducting power devices, it is desirable to have a high electrical conductivity and high thermal conductivity substrate with high electrical conductivity across the bonding interface. A metal or doped silicon layer at the bonding interface may be advantageous for electrical current conduction across the interface. Alternately, hydrophobic bonding using hydrogen termination, which eliminates native oxide at the bonding interface, can be used to allow current conduction across the bonding interface.

Another object of this invention to provide the structure and method for a laterally tiled array of thin single-crystal CdTe, CdZnTe, InSb material substrates that are bonded to the surface of a infrared transmissive large diameter silicon substrate (or silicon substrate with a thin surface oxide layer) utilizing the techniques of hydrogen and/or helium ion implant layer splitting and wafer bonding for the purpose of making an effectively large substrate of single-crystal CdTe, CdZnTe, InSb material for the purpose of manufacturing infrared imager arrays. HgCdTe epitaxial material would be grown on the CdTe or CdZnTe substrates and InSb epitaxial layer potential grown on the thin laterally tiled single-crystal InSb layer for the purpose of making infrared detectors in the material. Since the silicon substrate is transmissive in the infrared, the infrared detector arrays can be backside illuminated which is desirable for the case that the infrared detector array is bump bonded to a silicon readout integrated circuit.

Another object of this invention to provide the structure and method for a laterally tiled array thin III-V single-crystal material substrate materials such as GaSb, InAs, InGaAs, InGaSb, InSb, GaAs GaP, InP, etc. materials that are bonded to the surface of a large diameter microwave insulating handle substrate for the purpose of manufacturing light emitting devices (LED) and lasers. In some cases, for LEDs, it is desirable that the large diameter handle substrate be transparent to the emitted light. Examples of large diameter substrates that are optically transparent include GaAs, sapphire, and quartz. Heteroepitaxal layers of III-V material can be grown on the laterally tiled single crystal layers to obtain the preferred structure for LEDs and lasers. LED and lasers fabricated in SiC, GaN, GaInN, and ZnS based materials can be made using similar material structure as described above for the III-V materials.

Another object of this invention to provide the structure and method for a laterally tiled array thin III-V single-crystal material substrate materials such as GaSb, InAs, InGaAs, InGaSb, InSb, GaAs GaP, InP, etc. materials that are bonded to the surface of a large diameter microwave insulating substrate for the purpose of manufacturing microwave transistors and integrated circuits. Epitaxial layers will be typically grown on the thin III-V single-crystal layers and microwave devices fabricated in the grown epitaxial material although it is possible that electronic devices can be fabricated in the thin single-crystal material directly without additional epitaxial layer growth. It is generally desirable that the thin single-crystal material is selected so that there is a good lattice match to the lattice constant of the epitaxial growth material. It may be desirable to have an insulating layer such as silicon dioxide located between the microwave insulating substrate and the laterally tiled array of thin single-crystal layers to provide benefits such as reduced susceptibility to single event upset due to a large plasma of hole and electrons generated by incident high energy particles into the handle substrate or to reduce leakage currents from the handle substrate to the thin III-V layer.

Another object of this invention is to provide a method to fabricate a material structure where there is an additional material layer between the thin laterally tiled single-crystal material layer and the large diameter handle substrate. The additional material layer may be a dielectric layer to provide electrical insulation, a low melting point material to allow viscous flow for a compliant substrate, or a silicide or metal to aid bonding and vertical electrical current conduction across the bonding interface. In some cases (such as for poly-SiC, poly-AlN, or poly-diamond), it is difficult to polish the large diameter handle substrate or the single-crystal material surface to a surface roughness sufficiently small for wafer bonding or anodic bonding. An alternative approach is to deposit a material layer such as polysilicon, silicon oxide, silicon nitride, glass, or metal on the handle wafer or single-crystal material surface and polish the deposited material to a small surface roughness that is suitable for wafer bonding. An example of an interposed layer of a material that becomes viscous at the epitaxial layer growth temperature between the thin laterally tiled single-crystal layer and the non-single crystalline substrate can be used so that a thin compliant layer expands or contracts during the epitaxial layer growth to achieve compliant growth of the epitaxial layer.

Another object of this invention to provide the structure and method for a laterally tiled array thin single-crystal material substrate materials substrates for thin film growth that are bonded to a large diameter handle substrate. Several examples of thin single-crystal material substrates that are often used for thin film growth of ferroelectric, electro-optic, non-linear optic and high temperature superconducting thin film growth are: MgO, $SrTiO_3$, and $LaAlO_3$. For example, $SrBaTiO_3$ and $BaTiO_3$ ferroelectric films are often grown on MgO and YBCO high temperature superconductor are often grown on $SrTiO_3$ and $LaAlO_3$.

Other useful thin laterally tiled single-crystal materials that are bonded to a large diameter handle substrate include LiNbO3 for piezoelectric and electro-optical properties, SrBaNbO3 for photorefractive properties and crystalline metals.

The invention uses the wafer bonding technique to bond a thin single crystal material to a non-single crystalline substrate with the non-single crystalline substrate selected to have certain mechanical, thermal expansion, thermal conduction, and electrical conduction characteristics, and the further growth of a single crystal material on a thin wafer bonded material layer.

The manufacturing method can be such that a number of normal thickness single crystal substrates are first adhered to a support substrate, the surfaces of the single-crystal material on the support substrate polished to a small surface roughness on one time, a dielectric layer optionally deposited on the surface, a hydrogen and/or helium implant made into the single-crystal material, the surfaces of the single-crystal material bonded to a large diameter handle substrate, the splitting operation is caused to happen, the exposed surface of the single crystal material where the crystal splitting has occurred is polished or etched.

An aspect of the present invention is a method for growing a single crystal material layer on a thin single crystal layer that is bonded to a non-crystalline substrate, having the steps: (a) using techniques that include wafer bonding and other known techniques to form a thin single crystal material layer or plurality of layers on a non-crystalline substrate (in some cases, an additional material layer or layers can be interposed between the non-crystalline substrate and the thin single crystal material layer), (b) optionally growing a carbonization or buffer layer on the thin bonded high oriented layer, and (c) growing a single crystal material layer or plurality of layers on the thin single crystal layer.

Another aspect of the present invention is a method for growing a thin single crystal material layer on a first substrate, transferring the thin single crystal layer to a non-crystalline substrate, having the steps: (a) growing a single crystal material layer on a first substrate, (b) implanting hydrogen to a selected depth into the first substrate; (c) bonding the thin single crystal layer to a non-single crystalline substrate; and cause the first substrate to split at the selected depth. d) etching the remaining first substrate material to the single crystal substrate (g) growing a single crystal material layer or plurality of layers on the thin bonded layer.

Another object of this invention is to provide a method to fabricated a material structure where there is an additional material layer between the thin single crystal material layer and the non-signal-crystalline substrate with the further growth of a wide bandgap material layer on the surface of the material structure. The additional material layer may be a dielectric layer to provide insulation, a low melting point material to allow viscous flow for a compliant substrate, or a silicide or metal to aid bonding and vertical electrical current conduction. In some cases, it is difficult to polish the non-single crystalline substrate to a surface roughness sufficiently small for direct wafer bonding. An alternative is to deposit a material layer such as polysilicon, silicon oxide, silicon nitride, glasses, or metal on the non-single crystalline surface and polish the deposited material to a surface roughness suitable for direct wafer bonding.

Another object of this invention is to provide a method to grow highly oriented or single-crystal material layers on a wafer bonded thin highly oriented or single-crystal material layer on non-single-crystalline substrate with the non-single-crystalline substrate selected to have thermal expansion properties matched to the grown highly oriented or single-crystal material layer.

Another object of this invention is to provide a method to grow highly oriented or single-crystal material layers on a wafer bonded thin highly oriented or single-crystal material layer on non-single-crystalline substrate where the non-single-crystalline substrate is selected to have desired high thermal conduction properties for high power devices.

Another object of this invention is to provide a method to grow highly oriented or single-crystal material layers on a wafer bonded thin highly oriented or single-crystal material layer on non-single-crystalline substrate where the non-single-crystalline substrate is selected to have high electrical insulating properties for certain device types, or high electric conducting properties for other device types.

Another object of this invention is to provide a method to grow highly oriented or single-crystal material layers on a wafer bonded thin highly oriented or single-crystal material layer on non-single-crystalline substrate where the non-single-crystalline substrate is selected to have high optical transmission properties and/or electrical conduction properties for certain device types such as LED or infrared detectors.

Another object of this invention is to provide a method to form grooves in the compliant layer at selected lateral separations to allow the compliant layer to expand or contract without buckling during the growth of highly oriented or single-crystal material layers.

Another object of this invention is to provide a method to fabricated a material structure where there is an additional material layer between the thin highly oriented material layer and the non-signal-crystalline substrate with the further growth of high oriented (wide bandgap) material layer on the surface of the material structure. The additional material layer may be a dielectric layer to provide insulation, may be a low melting point material to allow viscous flow for compliant substrate, may be a silicide or metal to aid bonding and vertical electrical current conduction. In some cases, it is difficult to polish the non-single-crystalline substrate to a surface roughness sufficiently small for direct wafer bonding. An alternative is to deposit a material layer such as polysilicon, silicon oxide, silicon nitride, glasses, or metal on the non-single-crystalline surface and polish the deposited material to a surface roughness suitable for direct wafer bonding.

The individual substrates may be bonded to the large diameter substrate one at a time. However, it may be possible to have a fixture so that a large number of smaller substrates are bonded to the larger substrate all at one time. Since the no further epitaxial growth is necessary, there is additional flexibility in the approach to bonding the individual substrates to the large substrate (for the case that epitaxial growth, it is necessary to use direct bonding or high purity bonding materials). If the splitting temperature is low enough, organic adhesive can be used. For the case of the AlSb/InAs material system, there are typically no further high temperature steps during processing, so that organic adhesives are a possibility.

The individual substrates are reusable after the splitting operation. In this case, the substrates would be likely to have to be repolished, additional upside down epitaxial material grown, and the above process repeated utilizing the techniques of hydrogen ion implant layer splitting and wafer bonding for the purpose of making an effectively large substrate of thin single-crystal material for the purpose of manufacturing electronic devices in the thin single-crystal material and growing epitaxial layers on the thin single-crystal material. In addition, since only a thin layer of single-crystal material is split-off of a thick first substrate, a large number of thin single-crystal material layers can be obtain from each thick first substrate reducing the effective cost for effectively large substrates of the thin single-crystal material. The invention also describes approaches for compliant substrate by having a viscous layer between the thin single-crystal material and the large diameter substrate.

The invention uses the techniques of hydrogen ion implant layer splitting and wafer bonding for making a laterally tiled array of thin single-crystal material substrates that are bonded to the surface of a large diameter substrate for the purpose of making an effectively large substrate of thin single-crystal material. The large diameter substrate can be selected to have certain mechanical, thermal expansion, thermal conduction, electrical conduction, and optical transmission characteristics. Epitaxial material layers can be grown on the surface of the laterally tiled array of thin single-crystal material substrates, or devices can be formed in the thin single-crystal material substrates without further epitaxial material growth.

An aspect of the present invention is a structure and method for making a laterally tiled array of thin single-crystal material substrates that are bonded to the surface of a large diameter substrate for the purpose of making an effectively large substrate of thin single-crystal material having the steps: (a) bonding multiple single-crystal substrate to a support substrate, (b) polishing the surface on the multiple substrates (c) implanting hydrogen into surface of the multiple single-crystal substrates at a selected depth, (d) bonding the surface of the multiple substrates to a large diameter handle substrate and cause the first substrate to split at the selected depth to from a laterally tiled array of thin single-crystal material substrates; (f) polishing the surface of the split surface, (g) growing additional epitaxial material on the surface, (d) etching the remaining first substrate material to the highly oriented or single-crystal substrate (g) growing a highly oriented or single-crystal material layer or plurality of layers on the thin bonded layer.

(e) splitting the 1 (a) using techniques that include hydrogen ion implant wafer bonding and other known techniques to form a thin single-crystal material layer on a large diameter substrate and (b) growing a epitaxial material layer on single-crystal layer.

Another aspect of the present invention is a method for growing a thin highly oriented or single-crystal material layer on a first substrate, transferring the thin highly oriented or single-crystal layer to a non-crystalline substrate, having the steps: (a) growing a highly oriented or single-crystal material layer on a first substrate, (b) implanting hydrogen to a selected depth into the first substrate; (c) bonding the thin highly oriented or single-crystal layer to a non-single-crystalline substrate; and cause the first substrate to split at the selected depth. d) etching the remaining first substrate material to the highly oriented or single-crystal substrate (g) growing a highly oriented or single-crystal material layer or plurality of layers on the thin bonded layer.

BRIEF DESCRIPTION OF THE DRAWINGS

These and other objects, features and advantages of the invention, as well as the invention itself, will become better understood by reference to the following detailed description when considered in connection with the accompanying drawings wherein reference numerals designate identical or corresponding parts throughout the several views, and wherein.

DETAILED DESCRIPTION OF THE PREFERRED EMBODIMENTS

In this work several concepts are combined to produce substrates that are ideally suited for the growth of high quality SiC or GaN epitaxial layers. To overcome the thermal expansion mismatch, polycrystalline 3C-SiC wafers have been used as handle substrates. The poly 3C-SiC substrates, produced by chemical vapor deposition (CVD) and subsequent machining into wafers, are widely used in the microelectronics industry for wafer blanks and wafer carriers, and thus must be highly pure. The material is thermally matched to single-crystal SiC and GaN as shown in FIG. 1 and FIGS. 3 through 5. The poly 3C-SiC is also thermally stable permitting high temperature (<2600° C.) epitaxy and more optimal growth conditions of epitaxial SiC and GaN films. It is shown here that the substrate fabrication process is highly scaleable (poly 3C-SiC wafers are available up to 8") and initial results of carbonization and 3C-SiC epitaxy demonstrate that the hybrid substrate concept significantly improves film quality.

Figure 1:
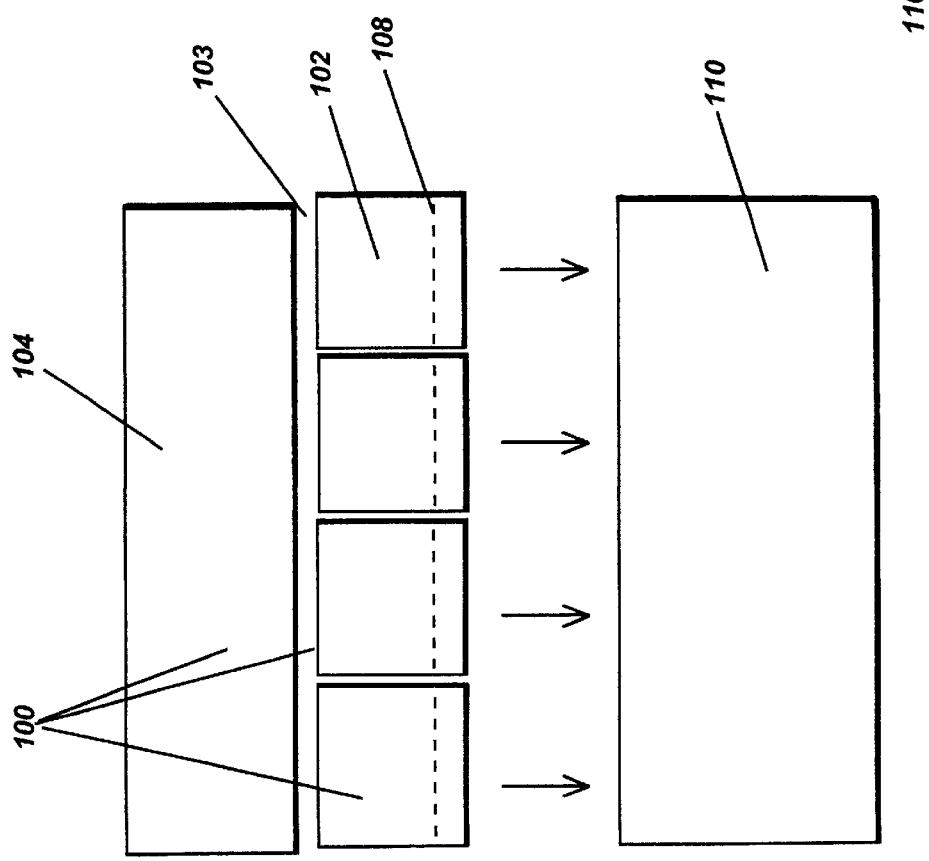
FIG. 1 illustrates a sequence of steps for making an ultra-thin direct bonded semiconductor layer.
Figure 4:
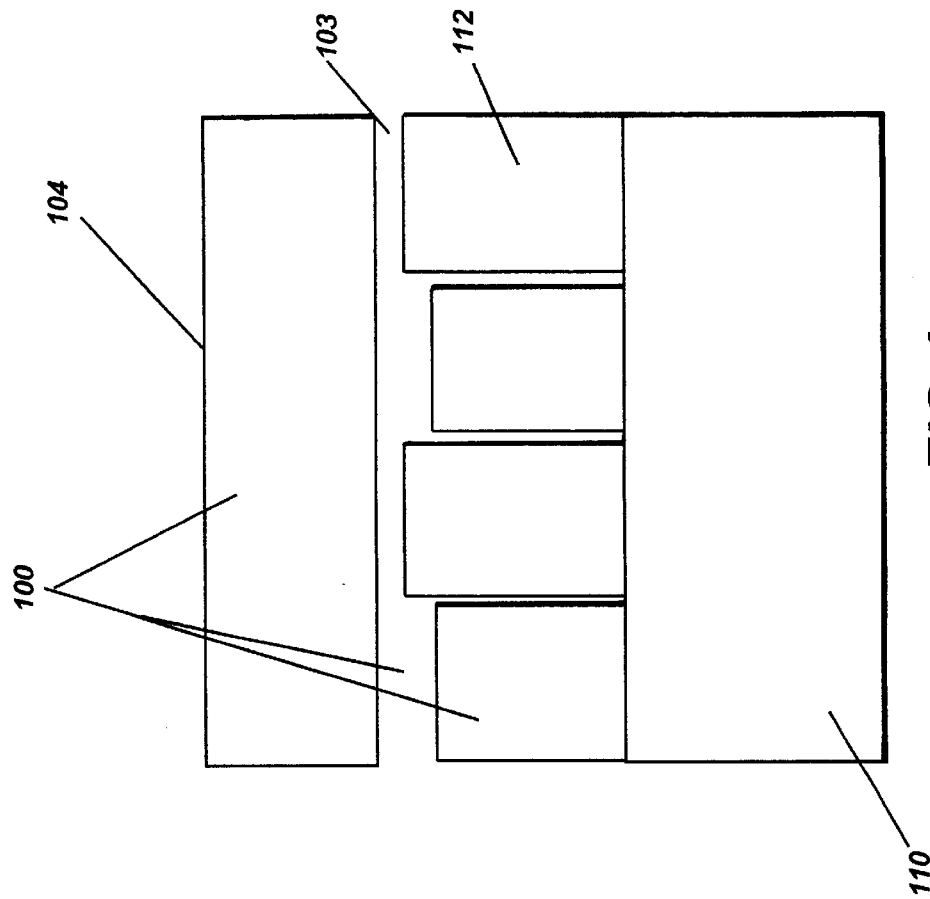
FIG. 4 illustrates an array single-crystal substrates of different height on a handle substrate.

One of the primary approaches for forming the poly-SiC substrate with the mosaic array of single-crystal substrate bonded to the front surface is shown in FIG. 1. The key processing steps for this approach is:

Make a substrate 100 by attach multiple single-crystal SiC substrates 102 to a support wafer 104.

There can be several different way of attaching 103 the multiple single-SiC substrates 102 to the support wafer 104. The various attachment techniques include using direct bonding, brazing, ceramic adhesive, spin-on-glass adhesive, graphite adhesive, glass bonding, preceramic polymer adhesive, refractory metal or direct bonding. It is desirable that the support wafer 104 be ultra-flat and can withstand processing temperatures >800° C. The support wafer 104 can be silicon or poly-SiC.

2. Grind and polish the surface of Substrate 100 consisting of the multiple single-crystal SiC substrates 102 that are bonded to the support substrate 104 so that the surfaces have a small surface roughness and are at the same height as shown in FIG. 1.

Figure 2:
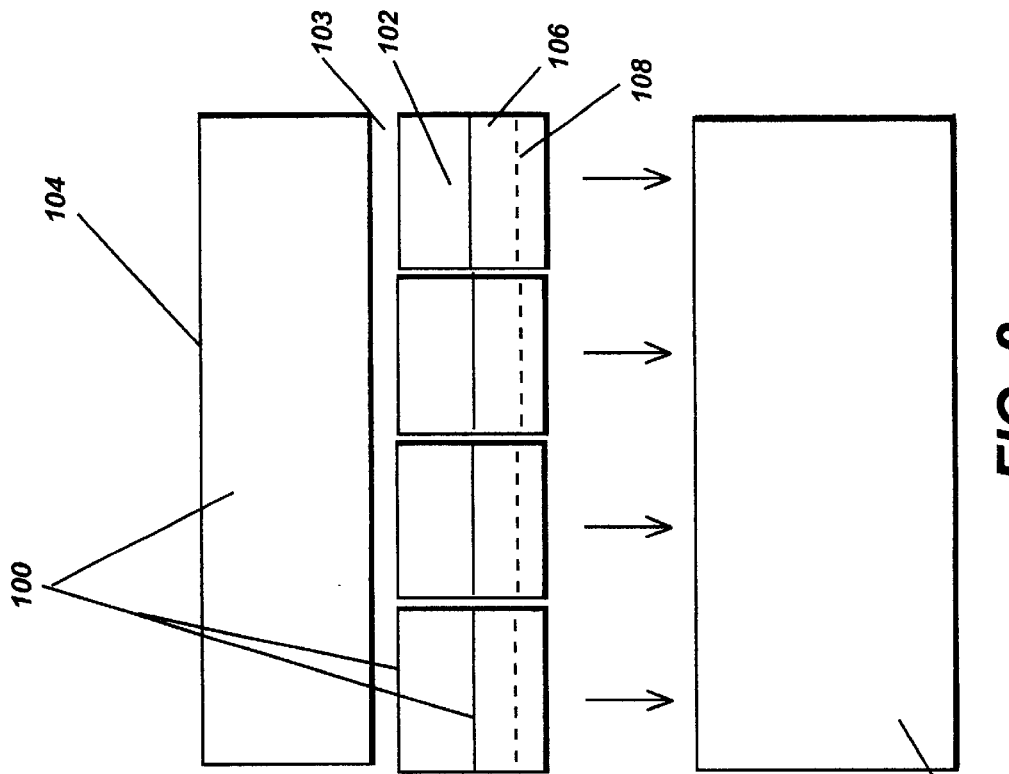
FIG. 2 illustrates a cross-section of single-crystal substrates adhered to a wafer substrate and epitaxial layers and hydrogen ion implant layers.

3. Option—An epitaxial layer 106 can be grown on the surface 102 as shown in FIG. 2. If the goal is to obtain a lot of hydrogen ion implant splitting of epitaxial material that can be bonded to poly-SiC Substrate 110, then a thick (25 $\mu$m to 100 $\mu$m) epitaxial layer 106 would likely be grown to obtain on the order of 25 to 100 splits as described below. It may be necessary to polish the surface of the epitaxial layer 106 after it is grown to obtain sufficiently small surface roughness for bonding.

4. Option—A material layer of oxide, nitride, or silicon layer can be deposited on the surface of the single-crystal SiC at this step. The material layer will reduce the depth of the hydrogen ion implantation into SiC carbide indicated in step 5 and may be useful for the case that a SiC-on-insulator substrate is desired. This oxide layer can be stripped after the hydrogen ion implant for the case that a SiC-on-insulator substrate is not desired.

5. Implant hydrogen 106 (into single-crystal substrates 102 of Substrate 100) with a dose of approximately >$5\times10^{16}$ cm$^{-2}$ and an energy of 90 KeV (depth of approximately 800 nm into SiC) for the purpose of implementing hydrogen ion implant layer splitting. This ion implantation can be performed at room temperature, high temperature, or even cryogenic temperature to optimize the hydrogen ion layer implant layer splitting characteristics. Also, there can be some advantages to co-implanting He, boron, silicon, argon, etc. so that the peak of the implant is at approximately the same location as the peak of the hydrogen implant. The primary advantage of co-implanting He, boron, silicon, argon, etc. are to achieve either a lower splitting temperature or low hydrogen ion implant dose than a hydrogen ion implant alone.

6. Perform Polish 1 step to polish poly-SiC handle substrate 110 to a small surface roughness ($\approx$<1 nm) for the case that direct bonding will be used. If a high temperature adhesive 103 is used, it may not be necessary to perform the Polish 1 step to bond Substrate 100 to Substrate 110 prior to thermal anneal step to split-off Substrate 100. Much of the complicated processing in Steps 7 and 8 are removed if a high temperature adhesive is used.

7. Clean the surfaces of single-crystal substrates 102 of substrate 100 and Substrate 110 poly-SiC substrate. The typical cleaning procedure would be to use RCA1 clean, piranha and possibly UV ozone or oxygen plasma to remove hydrocarbons. For applications where there will vertical current flow across the single-crystal SiC/poly-SiC interface a hydrophobic clean procedure consisting of HF last clean or HF vapor clean will likely be used since there will be no or very little native oxide at the interface. It is also possible that a hydrophilic bonding that forms a thin native oxide on each of the Substrate 100 and Substrate 110 surface can be used even for the case of vertical current flow if temperatures>approximately 1100° C. is used since the oxygen will likely diffuse into the SiC and thus not impede vertical current flow. For the case where there is only lateral current flow in the silicon-crystal SiC or epitaxial layers grown on the single-crystal SiC, then it is likely that a hydrophilic clean procedure will be used that leaves some form of native oxide at the interface. If a SiC-on-insulator structure is desired, then there can be thicker oxide grown on either the poly-SiC surface, the single-crystal SiC surface and then polished.

8. Direct bond single-crystal substrates 102 of substrate 100 to poly-SiC Substrate 110 to form an array of single-crystal substrates 112 on a handle substrate 110. Substrate 110 can typically be a poly-SiC substrate, but can also be a silicon substrate for the case that the temperature does not exceed approximately 1350 C. Thus, a silicon Substrate 110 can be used for the case that the thin single-crystal SiC can be used without additional SiC epitaxial growth (typically 1500° C. growth) or GaN epitaxial layer 118 is grown (typical growth temperature 1000° C). Substrate 100 or Substrate 110 can have an oxide layer on the surface to form a SiC-on-insulator substrate. A low temperature anneal (approximately 250° C.) to increase the bond strength prior to hydrogen layer splitting may be desirable. Surface oxide layers and hydrocarbons can be desorbed from the surfaces of Substrate 100 or 110 in ultra-high vacuum and then bonded. High temperature and pressure applied during the bonding process can also be used to aid the bonding.

High temperature adhesive bonding can potential be used to bond Substrate 100 to Substrate 110. Non-conductive (for lateral microwave devices) bonding techniques include ceramic adhesive, spin-on-glass adhesive, glass bonding, or preceramic polymer adhesive. Conductive bonding (for vertical current conducting device) techniques include brazing, refractory metal, ceramic adhesive, graphite adhesive, possibly preceramic polymer adhesive, graphite cement, or direct bonding. The primary advantage of using a high temperature adhesive is that Polish 1 and Polish 3 Steps to achieve a small surface roughness in order to direct bond may not be required. Also, many of the cleaning steps in Step 7 may not be required.

If some of the adhesive discussed in the above paragraph are used, it may be desirable to heat the bonded substrate in a different system from the epitaxial growth system to drive off organic binders and drive off impurities.

It may also be desirable to deposit a material such as silicon nitride that would cap the bond joint area so that the impurities in the high temperature adhesive material are confined to bond joint area.

9. Heat the bonded wafer pair to approximately 300° C.–900° C. to cause the hydrogen gas to expand and split-off Substrate 100 at the location of peak the hydrogen implant 108 dose. Other splitting techniques include directing a high-pressure gas stream or water stream at the side of the wafer.

10. The surface thin single-crystal SiC layers 112 that is now bonded to the poly-SiC substrate 110 has a rough surface and possibly amorphous surface. Several options are available to remove the surface damage. A Polish 2 step can used to polish the surface to a depth of 50 nm to 100 nm to remove the surface damage and defects. The surface can be oxidized and then the oxide etched in dilute HF to remove the surface damage and defects. The surface can also be possibly etch using either plasma etch techniques or chemical etch techniques.

11. Option—Implant vanadium 116 into the thin single-crystal SiC substrate 112 to make the thin layer semi-insulating for the case of a lateral microwave device, or ion implant dopant into the thin single-crystal silicon layer to make them conductive for the case of vertical current conduction device.

12. SiC or GaN epitaxial layers 118 can now be epitaxially grown on the surface. Some of the damage surface of the SiC can be sublimed to a depth of 100 nm to 200 nm by heating at a high temperature (1500° C.) to remove the surface damage discussed in Section 10.

Figure 3:
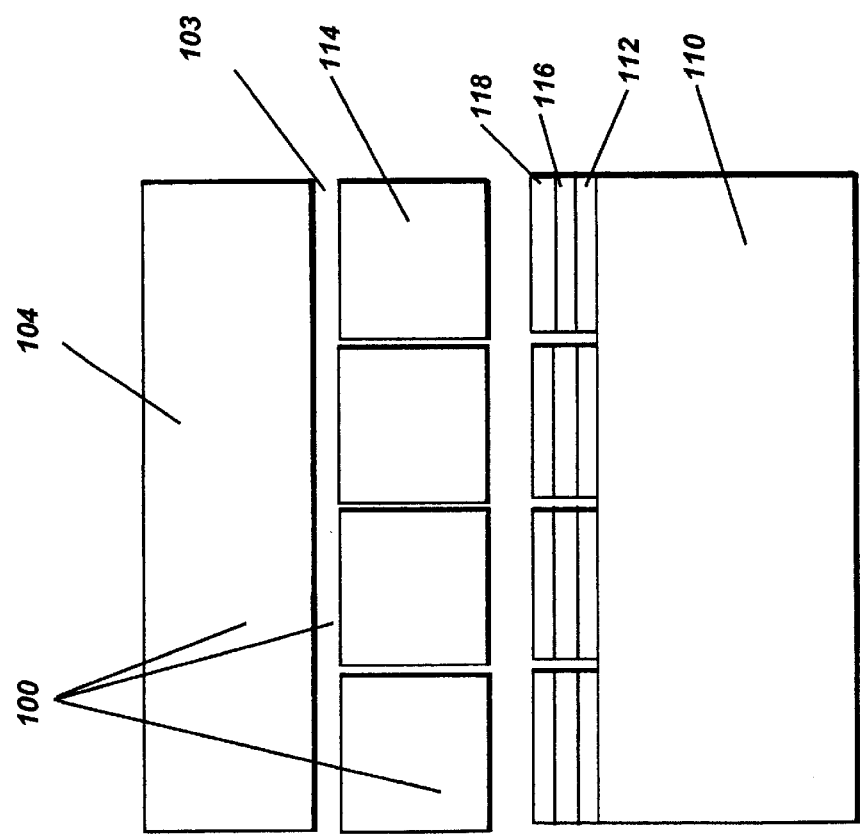
FIG. 3 illustrates an array single-crystal substrates on a handle substrate, remaining single-crystal substrates on a wafer substrate, a vanadium layer and an epitaxial layer.
Figure 5:
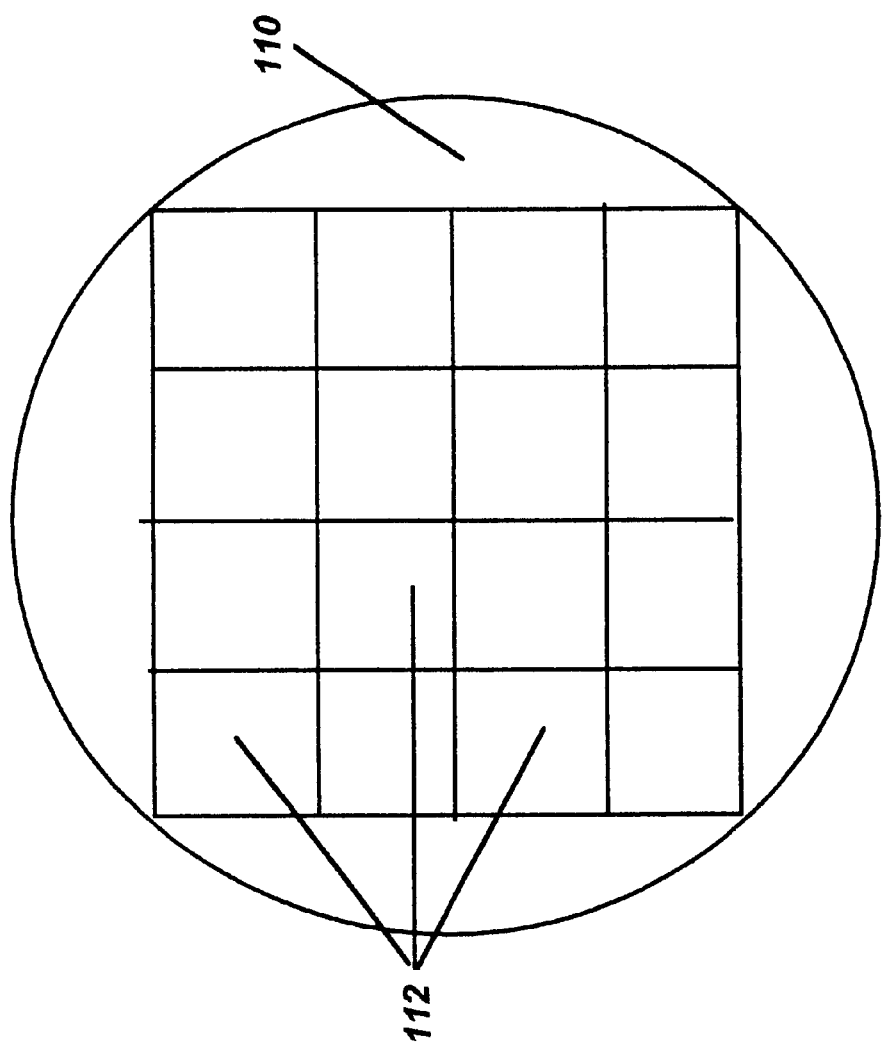
FIG. 5 illustrates a top view of handle wafer with an array of single-crystal substrates.

13. To repeat steps 4–12, perform Polish 3 step to polish (likely chemical mechanical polish) approximately 50 nm of Substrate 100 surface to polish away the 15 nm of surface roughness created by the hydrogen ion implant layer splitting as shown in FIG. 3. If a high temperature adhesive is used to bond Substrate 100 to Substrate 110, it may not be necessary to perform this polishing step.

Repeat the process in steps 4–12 multiple times to make a multiple substrate that have mosaic array of single-crystal SiC 112 bonded to poly-SiC substrate 110. It is estimated that approximately 1 μm of single-crystal SiC will be removed from Substrate 100 during each splitting and polishing operation. Thus, for a Substrate A100 thickness off approximately 300 μm, there should be greater than 200 split-off substrates from this one substrate. For the case of a 50 μm thick epitaxial layer 106 that is grown on Substrate 100 as described in Step 3, there should be 30 to 50 split-off substrates. The primary economical advantage of this approach come from the fact that it is possible to obtain a large number of thin split-off substrates from a single Substrate 100 as single-crystal substrate portions 114 remain on the handle substrate 104.

As noted above, the invention uses wafer bonding to form a thin, highly oriented or single-crystal material layer on a non-single-crystalline substrate and subsequent growth of highly oriented 118 or single-crystal material layer on the thin bonded highly oriented or single-crystal material layer. Techniques that utilize hydrogen ion implant layer splitting, etching to etch stop or polishing, along with wafer bonding can be used to form the thin highly oriented or single-crystal wafer bonded layer. In addition, normal grinding and etch stop techniques can be used to produce thin highly oriented or single-crystal layers.

Most of the description below discusses techniques of forming thin single-crystal substrates on a polycrystalline SiC substrate, however, the same techniques (possibly with additional interposed material layers to facilitate wafer bonding) apply to forming SiC or GaN single-crystal material layers on a polycrystalline SiC substrate, a AlN ceramic substrate, diamond, silicon nitride ceramic, graphite, or other non-single-crystalline substrate.

It should therefore readily be understood than many modifications and variations of the present invention are possible within the purview of the claimed invention.

What is claimed is:

1. A method for making an array of thin single-crystal substrates on a handle substrate, comprising the steps of:
    implanting hydrogen to a selected depth into a surface of a single-crystal substrate;
    bonding at least one and one at a time of said single-crystal substrates to said surface of a handle substrate at selected lateral locations;
    splitting at said selected depth; and
    forming an array of thin single-crystal substrates on said handle substrate.

2. The method of claim 1, further comprising the steps of:
    polishing said single-crystal substrates bonded to said handle substrate to a selected surface roughness; and
    growing an epitaxial layer on said single-crystal substrates bonded to said handle substrate.

3. A method for making an array of thin single-crystal substrates on a handle substrate, comprising the steps:
    attaching a plurality of single-crystal substrates to a face of a support wafer;
    polishing said plurality of attached single-crystal substrates so that said single-crystal substrate surfaces are coplanar on said support surface and to a selected surface roughness;
    implanting hydrogen to a selected depth into said attached single-crystal substrates;
    bonding said polished and hydrogen implanted attached single-crystal substrates to a first handle substrate; and
    splitting said polished and hydrogen implanted attached single-crystal substrates at said selected depth thereby forming an array of thin single-crystal substrates on said first handle substrate and a support wafer having a remaining portion of said attached single-crystal substrates.

4. The method of claim 3, wherein said array of single-crystal substrates on said first handle substrate are semiconductor substrates.

5. The method of claim 3, wherein said single-crystal semiconductor substrates are selected from the group consisting of SiC, InAs, HgCdTe, GaAs, InP, GaSb, SrTiO3, Ge, sapphire, LiNbO3, LaAlO3 and MgO.

6. The method of claim 3, further comprising the step of:
    growing an epitaxial layer or thin film layer on said array of single-crystal substrates attached to said first handle substrate.

7. The method of claim, further comprising the step of:
    polishing said plurality of said attached remaining single-crystal substrates on said support wafer to a uniform thickness and to a selected surface roughness;
    implanting hydrogen to a selected depth into said attached remaining single-crystal substrates on said support wafer;
    bonding said remaining single-crystal substrates on said support wafer to a second handle substrate;

splitting said polished and hydrogen implanted attached remaining single-crystal substrates to form a second array of thin single-crystal substrates on a second handle substrate and a support wafer having a remaining portion of attached single-crystal substrates.

8. The method of claim 7, further comprising the step of:
growing at least one epitaxial layer or thin film layer on said array of said single-crystal substrates bonded to said first or second handle substrates.

9. The method of claim 3, further comprising the step of:
growing an insulator layer on each of said plurality of single-crystal substrates prior to said step of implanting hydrogen.

10. The method of claim 3, wherein said polishing step comprises polishing to a surface roughness of less than 1 rms.

11. The method of claim 3, wherein said bonding step comprises a bonding process selected from the group consisting of direct bonding, anodic bonding, vacuum bonding, pressure bonding, diffusion bonding, spin-on-glass adhesive bonding, polymer adhesive bonding, frit glass bonding, ceramic bonding, graphite adhesive bonding, indium bonding, bump bonding, thermal compression bonding, thermal sonic bonding and ultrasonic bonding.

12. The method of claim 3, further comprising the step of:
implanting vanadium into said plurality of single-crystal substrates prior to said step of bonding said plurality of single-crystal substrates to said first handle substrate wherein said single-crystal substrates are semi-insulating.

13. The method of claim 3, wherein said first handle substrate is selected from the group having thermal conduction, thermal expansion, electrical resistivity, optical transparency properties and combinations thereof.

14. The method of claim 3, wherein said first handle substrate is selected from a group consisting of single-crystal material and non-crystalline material.

15. The method of claim 3, wherein said first handle substrate is encapsulated by a chemical vapor deposited layer to encapsulate impurities in said non-crystalline substrate.

16. The product of the process of claim 3.

17. A method for making an array of thin single-crystal substrates on a handle substrate, comprising:
attaching a plurality of single-crystal substrates having an epitaxial layer grown on a surface of said plurality of single-crystal substrates to a face of a support wafer;
polishing said plurality of attached single-crystal substrates so that said surfaces of said single-crystal substrates having an epitaxial layer are coplanar on said support wafer and to a selected surface roughness;
implanting hydrogen to a selected depth into said epitaxial layer;
bonding said polished and hydrogen implanted epitaxial layer to a first handle substrate; and
splitting said polished and hydrogen implanted epitaxial layer at said selected depth; and
forming an array of epitaxial material on said first handle substrate and a support wafer having a remaining portion of said attached single-crystal substrates and epitaxial layer.

18. The method of claim 17, further comprising:
growing an insulator layer on each of said plurality of single-crystal substrates prior to said step of implanting hydrogen.

19. The method of claim 17, wherein said polishing step comprises polishing to a surface roughness of less than 1 rms.

20. The method of claim 17, wherein said bonding step comprises a bonding process selected from the group consisting of direct bonding, anodic bonding, vacuum bonding, pressure bonding, diffusion bonding, spin-on-glass adhesive bonding, polymer adhesive bonding, frit glass bonding, ceramic bonding, graphite adhesive bonding, indium bonding, bump bonding, thermal compression bonding, thermal sonic bonding and ultrasonic bonding.

21. The method of claim 17, further comprising the step of:
implanting vanadium into said plurality of single-crystal substrates prior to said step of bonding said plurality of single-crystal substrates to said first handle substrate thereby making said single-crystal substrates semi-insulating.

22. The method of claim 17, wherein said first handle substrate are selected from the group having thermal conduction, thermal expansion, electrical resistivity, optical transparency properties and combinations thereof.

23. The method of claim 17, wherein said first handle substrate is selected from a group consisting of single-crystal material and non-crystalline material.

24. The method of claim 17, wherein said first handle substrate is encapsulated by a chemical vapor deposited layer to encapsulate impurities in said non-crystalline substrate.

25. The product of the process of claim 15.

* * * * *